(12) United States Patent
Roza

(10) Patent No.: US 7,152,086 B2
(45) Date of Patent: Dec. 19, 2006

(54) METHOD AND ARRANGEMENT FOR SAMPLE-RATE CONVERSION

(76) Inventor: Engel Roza, Prof. Holstlaan 6, 5656 AA Eindhoven (NL)

( * ) Notice: Subject to any disclaimer, the term of this patent is extended or adjusted under 35 U.S.C. 154(b) by 616 days.

(21) Appl. No.: 10/262,387

(22) Filed: Oct. 1, 2002

(65) Prior Publication Data

US 2003/0093448 A1 May 15, 2003

(30) Foreign Application Priority Data

Oct. 4, 2001 (EP) .................................. 01203770

(51) Int. Cl.
*G06F 17/17* (2006.01)
*H03M 7/00* (2006.01)

(52) U.S. Cl. .................. 708/313; 708/300; 341/61
(58) Field of Classification Search ................ 708/307, 708/713; 341/61, 144
See application file for complete search history.

(56) References Cited

U.S. PATENT DOCUMENTS 5,272,655 A  12/1993  Roza

| 5,708,433 A | * | 1/1998 | Craven ..................... 341/144 |
| 6,570,514 B1 | * | 5/2003 | Velazquez .................. 341/118 |
| 6,643,675 B1 | * | 11/2003 | Piirainen .................... 708/313 |

OTHER PUBLICATIONS

D. Birru; "A Generalized Mulltirate Topology of Reduced-Sample-Rate Sigma Delta Modulators With Optimum Coefficients", IEEE Signal Processing Letters, Aug. 1999, vol. 6, No. 8, pp. 196-198, XP002224976.

D. Birru; "Reduced-Sample-Rate Sigma-Delta Modulation Using Recursive Deconvolution" Intern, Journal of Circuit Theory & Applications, Chichester, GB, vol. 25, No. 5, Sep. 1997, pp. 419-437, XP001120299.

Roza: "Recursive Bitstream Conversion: the Reverse Mode," IEE Transaction On Circuits And Systems-II: Analog And Digital Signal Processing, vol. 41, No. 5, May 1994, pp. 329-336.

Roza: "Recursive Bitstream Conversion," IEE Transaction On Circuits And Systems-II: Analog And Digital Signal Processing, vol. 40, No. 2, Feb. 1993, pp. 65-72.

* cited by examiner

*Primary Examiner*—Chuong D. Ngo

(57) ABSTRACT

Method and arrangement for converting the sample rate of a higher sample rate discrete time signal to a lower sample rate discrete time signal or vice versa. A recursive signal processing algorithm with low pass filtering function is used, which entirely takes place at the lower sample rate. The impulse response of the low pass filtering function is a power series expansion

7 Claims, 4 Drawing Sheets

METHOD AND ARRANGEMENT FOR SAMPLE-RATE CONVERSION

Figure 1:
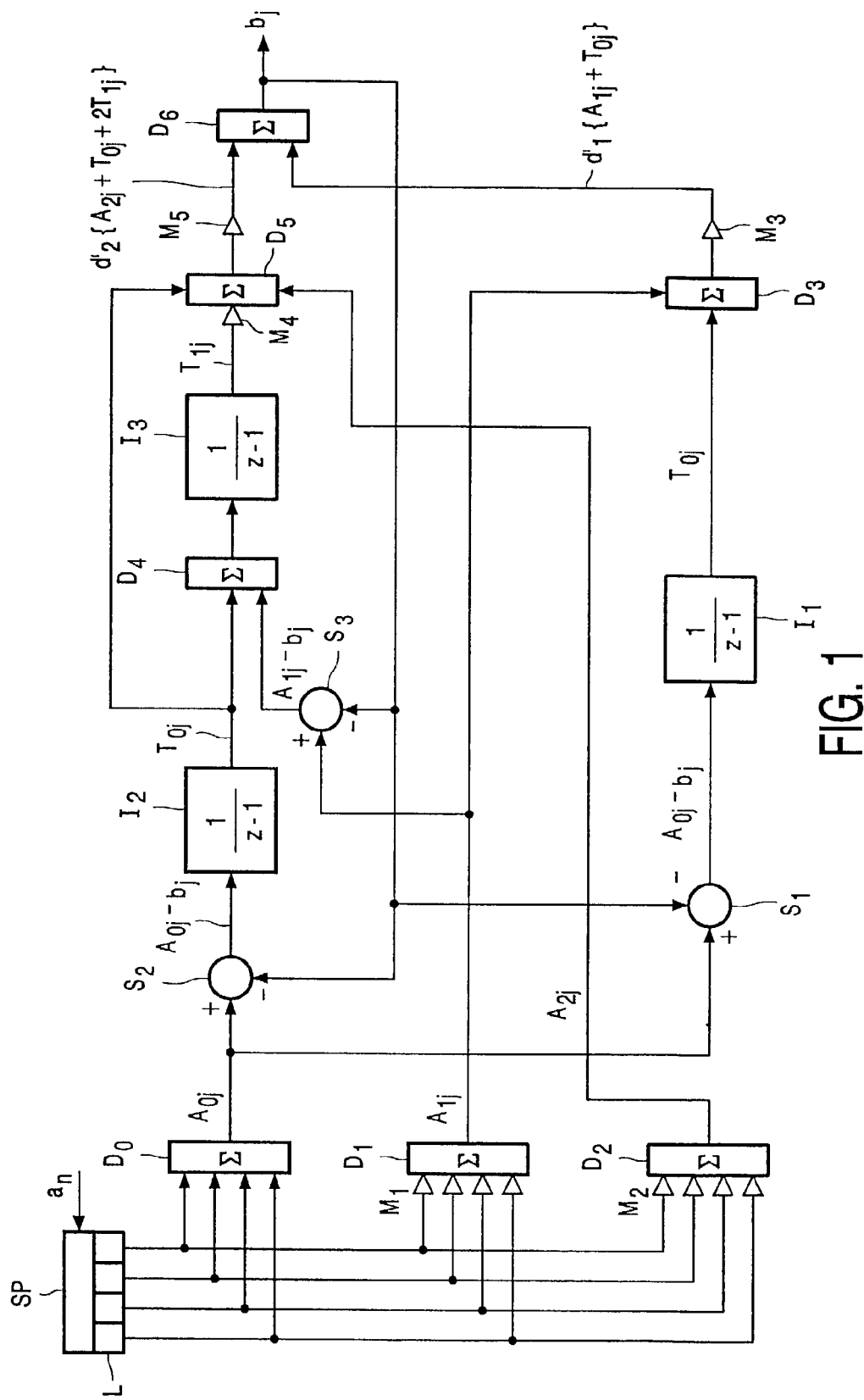

The invention relates to a method of converting the sample rate of a discrete-time input signal with sample rate $q.f_s$ to a discrete-time output signal with a sample rate $f_s$ which is a sub multiple of the sample rate of the input signal (q=integer larger than 1), the method comprising the steps of series to parallel converting the input signal to generate non-overlapping words of q samples of the input signal and of processing said words at the sub multiple rate $f_s$ in accordance with a recursive algorithm comprising a low-pass filtering function. Such method is known from the article "Recursive Bitstream Conversion" by E. Roza in IEEE Transactions on Circuits and Systems-II: Analog and Digital Signal-Processing, Vol. 40, NO 2, February 1993. The invention further relates to the reverse method of converting the sample rate of a discrete-time input signal with sample rate $f_s$ to a discrete-time output signal with a sample rate $q.f_s$ which is a multiple of the sample rate of the input signal (q=integer larger than 1), the method comprising the steps of processing said input signal at the sample rate $f_s$ in accordance with a recursive algorithm comprising a low-pass filtering function to obtain non-overlapping words of q samples of the output signal and of parallel to series converting said words to generate the discrete-time $q.f_s$ sample rate output signal.

The above-described methods have become known under the name: "Rebic" (recursive bit-stream conversion) and in this application the expression "forward Rebic" shall be used for the conversion of a low-precision high sample rate signal to a high precision low sample rate signal, while the expression "reverse Rebic" shall be used for the conversion of a high precision low sample rate signal to a low precision high sample rate signal. The low precision high rate signal may often be a "single bit" bitstream, where each sample comprises only one bit, although this signal occasionally may comprise more than one bit per sample.

Usually the generation of a "single bit" bitstream, either from an analog input signal or from a high precision low sample rate discrete signal, is done by a conventional $\Sigma\Delta$ modulator, which basically consists of a low pass filter and a clock-synchronized quantizer in feedback arrangement. This is a low cost and robust arrangement for performing the conversion. However, when signals with large base-bandwidth, such as e.g. video signals, have to be converted, the sample rate has to be extremely high in order to obtain sufficient noise shaping and then several drawbacks of the conventional $\Sigma\Delta$ modulator become apparent. The basic advantage of the above-described Rebic configuration is that it has a loop-configuration that operates at the lower clock rate, which is a fraction (1/q) of the clock rate that is required in conventional $\Sigma\Delta$ modulators. An out-of-loop parallel-to series converter is necessary and sufficient to produce a serial bitstream with similar properties as obtained from conventional configurations. The advantages of Rebic over conventional $\Sigma\Delta$ modulators are: reduction of high-speed circuitry, lower power consumption, less interference tones and increased stability in high-order configurations.

In the above referenced article the low-pass filter operation is achieved by an expansion of its impulse response into a series of exponential functions. In contradistinction, the present invention is based on the recognition that such exponential expansion is not obligatory and the method of sample rate conversion according to the present invention is therefore characterized in that the algorithm is based on a power-series expansion of the impulse-response of the low-pass filtering function. Such impulse responses may be obtained from discrete-time integrators and can therefore be obtained from actual digital circuitry more easily than conventional impulse responses. Preferably, the method according to the invention, both for the forward Rebic conversion and for the reverse Rebic conversion, is characterized in that the said processing is in accordance with the formulas (1) to (3e) of the accompanying formula sheet, wherein $a_n$ represents the sequence of samples of the discrete-time signal with sample rate $q.f_s$, wherein $b_j$ represents the sequence of samples of the discrete time signal with sample rate $f_s$, wherein $\alpha_m$ represent the coefficients of the power series of the impulse response of the low-pass filtering function and $\alpha_m'$ the said coefficients divided by the sum of all said coefficients. In this algorithm it is assumed that the impulse response of the low pass filtering function $$h(t) = U(t) \sum_{m=0}^{M} \alpha_m (t/T)^m,$$

which implies that the impulse response is zero at time t=0. Hereafter it will be shown that also other power series expansions of the impulse response may be used.

The invention also relates to an arrangement for sample rate conversion, which arrangement then usually comprises a number of integrators ($I_2$-$I_3$, $I_4$-$I_5$-$I_6$) in cascade i.e. that a former integrator in the cascade sends its output signal, together with one or more other signals, to the next integrator in the cascade. The Rebic structure may be of certain order, which is the order of the low pass filter function used in the Rebic algorithm. Normally the number of cascaded integrators in a low pass filter determines the order of the filter. This also applies to the Rebic algorithm. However it appears that, in case of a forward Rebic structure, one of the integrators is redundant so that the arrangement may preferably be characterized in that the number of integrators in the cascade of integrators is one less than the order of the algorithm.

It appears that in a reverse Rebic structure according to the invention it is not possible to calculate the samples $a_n$ of the high sample rate signal directly from the samples of the low sample rate signal. From equation (3c) of the enclosed formulas sheet it follows that the sequence $a_n$ is hidden in the sum $\Sigma\alpha_m' A_{mj}$, which is herein called the "bunch value" at the time j. In order to derive said sequence the reverse basic structure according to the invention is further characterized by comprising a mapper receiving a mapper input signal from said integrators in cascade and generating said non-overlapping words of q samples of the output signal. The task of the mapper is to establish a q-length binary sequence $a_n$ such that the bunch value $\Sigma\alpha_m' A_{mj}$ is close to the mapper input sequence. Because there are $2^q$ possible binary sequences of length q, there are also $2^q$ values of the bunch value to which the mapper input sequence will be mapped. One possible strategy could be to compare the most recent value of the mapper input sequence with a predefined table of all possible bunch values on the basis of a best fit. However, this can be quite cumbersome for large values of q. Therefore a preferred reverse Rebic structure according to the invention may preferably be characterized in that said mapper comprises a cascade of quantizer-subtracter combinations, each of said combinations comprising a 1-bit quantizer for generating one of the bits of said non-overlapping words of q bits and a subtracter for subtracting the input- and output-signals of the 1-bit quantizer, that the first of said combinations in the cascade receives the mapper input signal, that each of the other of said combinations in the cascade receives a weighed sum of the output signals of the subtracters of the previous combinations in the cascade and that a final quantizer receives a weighed sum of the output signals of all subtracters in the cascade and generates the final bit of said non overlapping words of q bits.

Further, in order to prevent the Rebic structure from becoming unstable, the arrangement according to the invention may further be characterized in that at least one of said integrators comprises a clipper.

Figure 2:
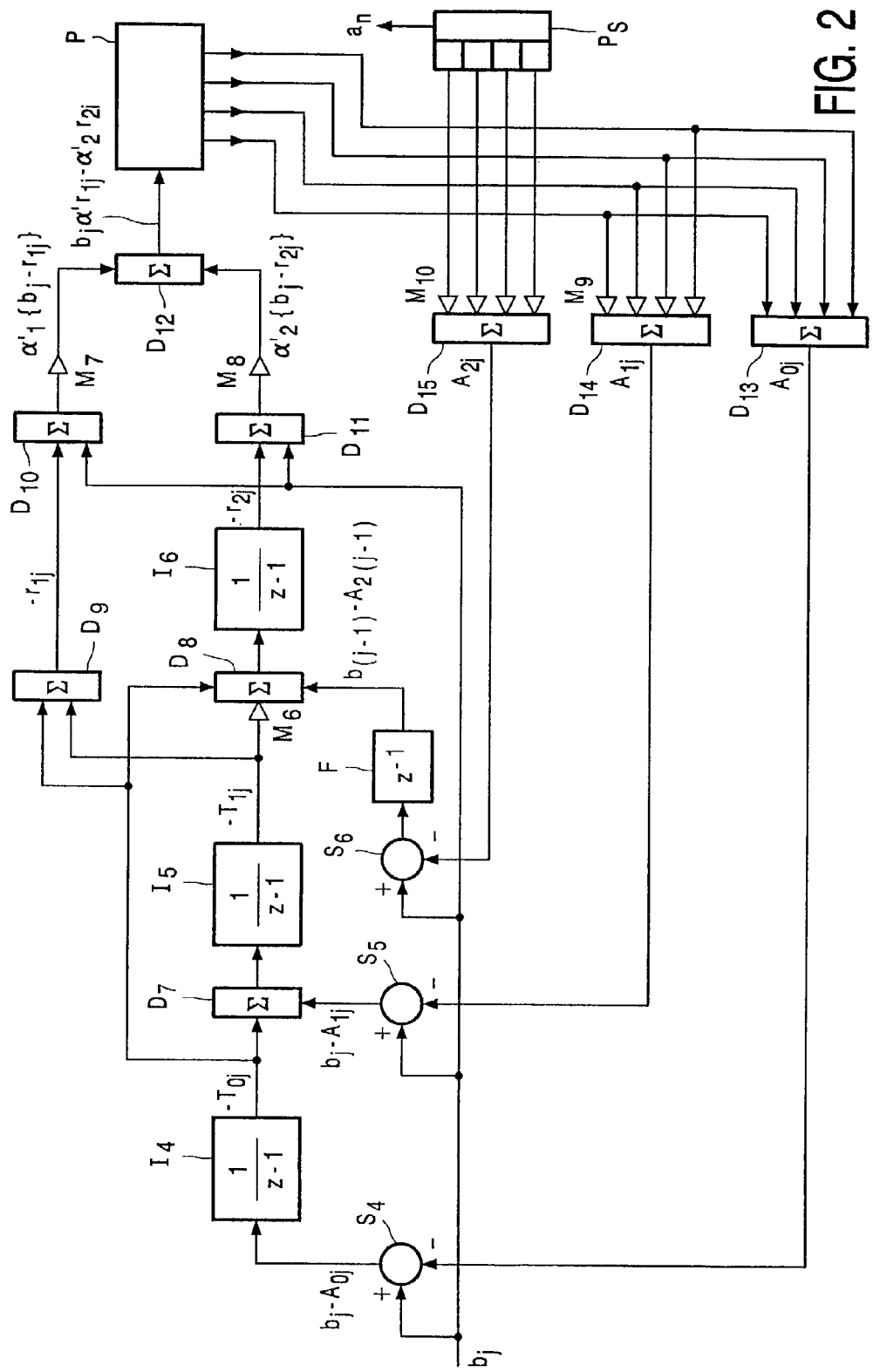
Figure 3:
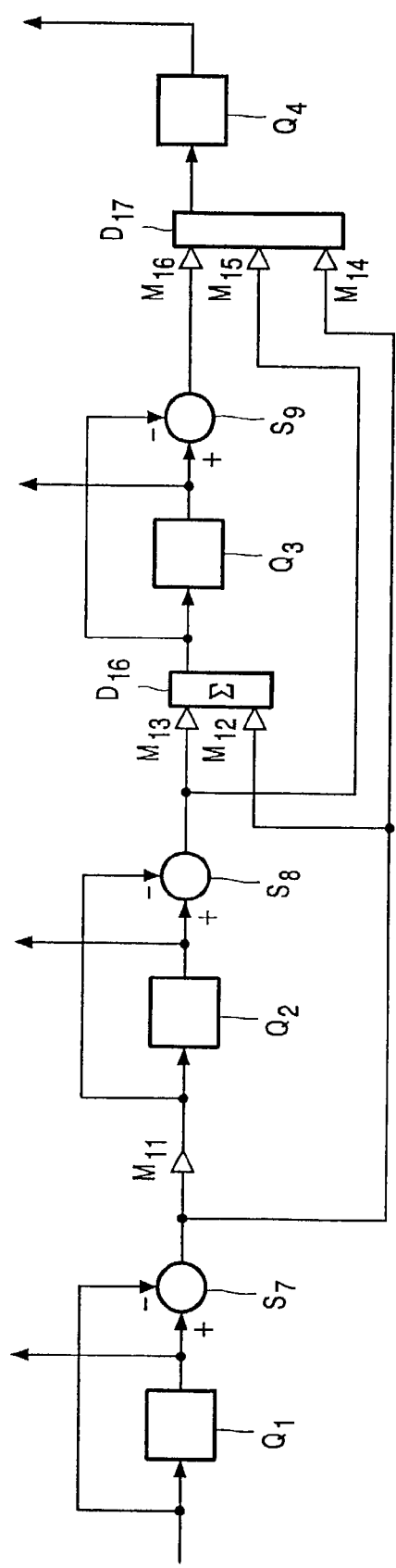
Figure 4:
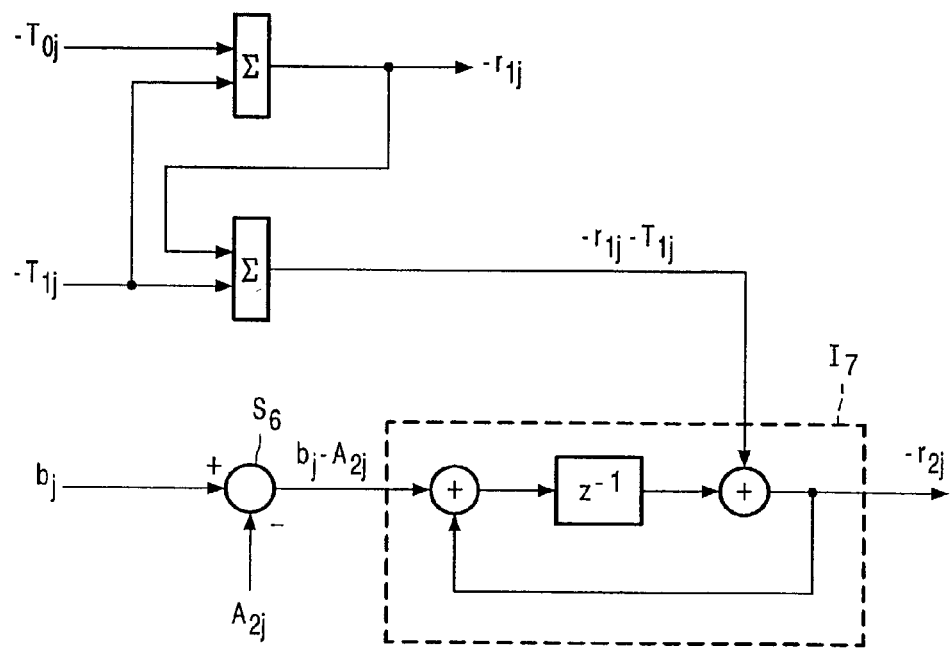
Figure 5:
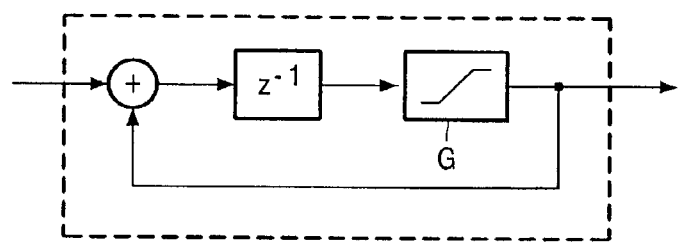

The invention will be described with reference to the accompanying formula sheet and to the accompanying figures. Herein shows:

FIG. 1 an embodiment of a forward Rebic sample rate converter according to the invention, FIG. 2 an embodiment of a reverse Rebic sample rate converter according to the invention, FIG. 3 an embodiment of a mapper for use in the reverse Rebic sample rate converter of FIG. 2, FIG. 4 a modification of part of the reverse Rebic sample rate converter of FIG. 2 and FIG. 5 a modification of an integrator for use in a Rebic sample rate converter according to the invention.

The algorithm used for the sample rate conversion is based on equating the response of the low pass filter operation to the high sample rate signal $a_n$ with the response of the said low pass filter operation to the low sample rate signal $b_j$. The impulse response of the low pass filter operation is an expansion in terms of a power series and may be expressed by the following formula:

$$h(t) = U(t) \sum_{m=0}^{M} \alpha_m (t/T)^m.$$

Herein is U(t) Heaviside's step function, M defines the order of the filter and $\alpha_m$ are the filter coefficients that can freely be chosen. When the two mentioned responses are equated the formula (1) of the formula sheet is obtained. In formula (2) this equation is split into four terms respectively representing from left to right: the most recent sample of the signal $b_j$, the filtered contribution from the q most recent samples of the signal $a_n$, the filtered history of the signal $a_n$ and finally the filtered history of the signal $b_j$.

In formula (2a) the coefficients $\alpha_m$ are replaced by the normalized coefficients $\alpha_m'$ that are obtained by dividing each coefficient $\alpha_m$ by the sum of all coefficients, with the result that $$\sum_{m=0}^{M} \alpha_m' = 1.$$

When $A_{ij}$ and $r_{ij}$ are defined as shown in formulas (3a) and (3b), the formula (2a) for $b_j$ becomes $$b_j = \sum_{m=0}^{M} \alpha_m'(A_{mj} + r_{mj})$$

as is shown in formula (3c). The value $r_{mj}$ may be recursively expanded so as to obtain the equation (3d) wherein the signal $T_{ij}$ is defined by equation (3e). The symbol $\binom{m}{i}$ in equation (3d) stands as usual for the binomial coefficient $$\frac{m!}{i!(m-i)!}.$$

The set of equations (3a) ... (3e) easily allows to determine a structure for implementing the algorithm, as will be shown afterwards with reference to FIGS. 1, 2 and 3.

The value of M determines the order of the Rebic. A $3^{rd}$ order Rebic is obtained when M=2, a $4^{th}$ order is obtained when M=3 and so on. Usually a filter of certain order requires an equal number of cascaded integrators. However, it appears that, in a forward Rebic, one of such integrators is redundant so that the number of cascaded integrators can be one less than the order of the Rebic. This follows from the formulas (4a) and (4b) of the formulas sheet. Formula (3c) represents the basic equation from which the new sample $b_j$ is calculated. One sample period earlier the sample $b_{j-1}$ has been calculated by the corresponding formula (4a). Because $$\sum_{m=0}^{M} \alpha_m' = 1$$

the term $b_{j-1}$ in this formula can be brought between the brackets, so that, using the $T_{ij}$-definition of formula (3e), the equation (4b) is obtained. This equation allows to calculate the last term $T_{Mj}$ without an integrator, when all other terms $T_{0j} \ldots T_{(M-1)j}$ are obtained through integration.

FIG. 1 shows a structure for the implementation of the algorithm for the case that M=2, $\{\alpha_m\}=\{0, \alpha_1, \alpha_2\}$ and q=4. Structures for other combinations of M, $\alpha_m$ and q can be readily established. In practice larger values of q will usually be applied. With these values for M and $\alpha_m$ the formula (3c) for $b_j$ becomes as is shown in formula (5a). Because from equation (3d) it follows that $r_{0j}=T_{0j}$, $r_{1j}=T_{0j}+T_{1j}$ and $r_{2j}=T_{0j}+2T_{1j}+T_{2j}$ the equation (5a) can be rewritten as shown in equation (5b). A structure for calculating $b_j$ in accordance with this formula would require (at least) three integrators. However, with equation (4b) it is follows that $\alpha_1'T_{1j}+\alpha_2'T_{2j}=0$ so that equation (5b) simplifies to equation (5c).

The left-hand part of FIG. 1 shows a series to parallel converter SP with 1-bit latches L, with which non-overlapping ("isolated") words of q 1-bit symbols of $a_n$ are down-sampled with a factor q. The words of q bits are applied to an adder $D_0$ for generating the signal $A_{0j}$, to a set of multipliers $M_1$ and an adder $D_1$ for generating the signal $A_{1j}$ and to a set of multipliers $M_2$ and an adder $D_2$ for generating the signal $A_{2j}$. The multipliers $M_1$ multiply the bits with the weighing factors 1/q, 2/q, 3/q ... q/q respectively and the multipliers $M_2$ multiply these bits with the weighing factors $(1/q)^2$, $(2/q)^2$, $(3/q)^2$ ... $(q/q)^2$ respectively, so that the generation of the signals $A_{0j}$, $A_{1j}$ and $A_{2j}$ is in accordance with formula (3a).

A subtracter $S_1$ generates the signal $A_{0j}-b_j$ that is applied to an integrator $I_1$. This is a "delaying" integrator, which has a Z-transform 1/(z-1) i.e. which has a 1-sample delay in its forward path and no delay in its feedback path. This is in contradistinction with a "non delaying" integrator, which has a Z-transform z/(z-1) i.e. which has a 1-sample delay in its feedback path and no delay in its forward path. The delaying integrator $I_1$ outputs the previous sample of the input signal plus the previous sample of the output signal. It easily follows from equations (3d) and (3e) that the output of integrator $I_1$ is then equal to $A_{0(j-1)}-b_{(j-1)}+r_{0(j-1)}=T_{0j}=r_{0j}$. This signal is added to $A_{1j}$ in an adder $D_3$ and the result is multiplied in a multiplier $M_3$ with the weighing factor $\alpha_1'$ to obtain the signal $\alpha_1'(A_{1j}+T_{0j})$.

A second subtracter $S_2$ and a second delaying integrator $I_2$ receive the same input signals as the subtracter $S_1$ and the integrator $I_1$ and consequently they generate the same output signal $T_{0j}$. A subtracter $S_3$ subtracts the signals $A_{1j}$ and $b_j$ and in an adder $D_4$ the result is added to the output $T_{0j}$ of integrator $I_2$ to generate the signal $A_{1j}-b_j+T_{0j}$. This is applied to a third delaying integrator $I_3$. From equations (3d) and (3e) it can be derived that integrator $I_3$ generates the signal $T_{1j}=A_{1(j-1)}-b_{j-1}+T_{0(j-1)}+T_{1(j-1)}$.

A multiplier $M_4$ multiplies the signal $T_{1j}$ with the factor 2 and an adder $D_5$ adds the signal $A_{2j}$ from the adder $D_2$, the signal $T_{0j}$ from the integrator $I_2$ and the signal $2T_{1j}$ from the multiplier $M_4$ together to generate the signal $A_{2j}+T_{0j}+2T_{1j}$, which is subsequently multiplied in a multiplier M5 by the weighing factor $\alpha_2'$ to generate the signal $\alpha_2'(A_{2j}+T_{0j}+2T_{1j})$. The signals from the multipliers $M_3$ and $M_5$ are finally added in an adder $D_6$ to obtain the output signal $b_j$ in accordance with equation (5c) of the formulas sheet.

It has to be noted, that the structure of FIG. 1 may be modified in several ways with the same end-result. For instance, the subtracter $S_1$ and the integrator $I_1$ can be deleted while the signal $T_{0j}$ for the adder $D_3$ can be obtained from the output of integrator $I_2$. Furthermore, the adders $D_3$, $D_5$, $D_6$ and the multipliers $M_3$, $M_4$ and $M_5$ can be replaced by a multiplier for multiplying the signal $A_{1j}$ from the adder $D_1$ by $\alpha_1'$, a multiplier for multiplying the signal $A_{2j}$ from the adder $D_2$ by $\alpha_2'$, a multiplier for multiplying the signal $T_{1j}$ from integrator $I_3$ by $2\alpha_2'$ and a single adder for adding the signals from these three multipliers and the signal $T_{0j}$ from integrator $I_2$ together to obtain the signal $b_j=\alpha_1'A_{1j}+\alpha_2'A_{2j}+T_{0j}+2\alpha_2'T_{1j}$. This expression is equal to that of formula (5c) because $\alpha_1'+\alpha_2'=1$.

The reverse Rebic process implies the determination of a bitstream $a_n$ from a given high precision multibit sequence $b_j$. The formulas (1) to (3e) of the formulas sheet equally apply to the reverse Rebic of this invention, although formula (3c) is preferably written as:

$$\sum_{m=0}^{M} \alpha'_m A_{mj} = b_j - \sum_{m=0}^{M} \alpha'_m r_{mj},$$

thereby indicating that the "bunch-value"

$$\sum_{m=0}^{M} \alpha'_m A_{mj}$$

is calculated from the input sequence $b_j$ and the calculated sequence $$\sum_{m=0}^{M} \alpha'_m r_{mj}.$$

It is clear that this formula does not allow to calculate $a_n$ directly, because the sequence $a_n$ is hidden in the bunch value $$\sum_{m=0}^{M} \alpha'_m A_{mj}.$$

Therefore a mapping process is needed to assign a particular word of q bits for each bunch value $$\sum_{m=0}^{M} \alpha'_m A_{mj}.$$

Several strategies for this mapping process are possible, such as "best fit, binary search", see the article "Recursive Bitstream Conversion, the reverse mode." By E. Roza in "IEEE Transactions on Circuits and Systems, vol. 41, no.5, pp. 329–336, May 1994 or "recursive mapping", see the article "Reduced-sample-rate sigma-delta modulation using recursive deconvolution." by D. Birru in "Int. Journal of Circuit Theory and Applications", vol. 25, pp. 419–437, 1997. So, once the value of $$\sum_{m=0}^{M} \alpha'_m A_{mj}$$

has been determined and mapping has taken place, a parallel to series conversion of bunches of q bits is necessary and sufficient to obtain q consecutive bits of the bitstream $a_n$.

FIG. 2 shows a possible structure for the implementation of the reverse Rebic process. To facilitate the comparison with the forward Rebic of FIG. 1, the same parameters M=2, $\{\alpha_m\}=\{0, \alpha_1, \alpha_2\}$ and q=4 have been chosen for the reverse Rebic of FIG. 2. A subtracter $S_4$ receives the signals $b_j$ and $A_{0j}$ and generate there from the difference $b_j-A_{0j}$. This signal is integrated to the signal $-T_{0j}$ in the delaying integrator $I_4$. A subtracter $S_5$ and an adder $D_7$ generate the signal $b_j-A_{1j}-T_{0j}$ and a delaying integrator $I_5$ integrates this signal to the output signal $-T_{1j}$. A multiplier $M_6$ doubles this signal to $-2T_{1j}$. A subtracter $S_6$ and a one-sample delay F generate from the two signals $A_{2j}$ and $b_j$ the output signal $b_{(j-1)}-A_{2(j-1)}$ and this signal is, together with the signal $-2T_{1j}$ from the multiplier $M_6$ and the signal $-T_{0j}$ from the integrator $I_4$, added in an adder $D_8$ and subsequently supplied to a non-delaying integrator $I_6$ to generate the signal $-r_{2j}$ at the output thereof. Moreover, the signals $-T_{0j}$ from the integrator $I_4$ and the signal $-T_{1j}$ from the integrator $I_5$ are added in an adder $D_9$ to generate the signal $-r_{1j}$.

The signals $b_j$ and $-r_{1j}$ are added in an adder $D_{10}$ and multiplied by the coefficient $\alpha_1'$ in a multiplier $M_7$ to obtain the signal $\alpha_1'\{b_j-r_{1j}\}$. Equally, the signals $b_j$ and $-r_{2j}$ are added in an adder $D_{11}$ and multiplied by the coefficient $\alpha_2'$ in a multiplier $M_8$ to obtain the signal $\alpha_2'\{b_j-r_{2j}\}$. $\alpha_2'\{b_j-r_{2j}\}$. Finally the two output signals of the multipliers $M_7$ and $M_8$ are added in an adder $D_{12}$ to obtain the mapper input signal $b_j-\alpha_1'r_{1j}-\alpha_2r_{2j}$, which, according to equation (5a) of the formulas sheet, should correspond with the bunch value $$\sum_{m=0}^{2} \alpha'_m A_{mj} = \alpha'_1 A_{1j} + \alpha'_2 A_{2j} ..$$

The mapper P generates during each sample period at its output a parallel word of q bits which, when put in series, represents q bits of the output signal $a_n$. The weighted sum of the mapper output signals is the bunch value $$\sum_{m=0}^{2} \alpha'_m A_{mj} = \alpha'_1 A_{1j} + \alpha'_2 A_{2j},$$

which should be as close as possible to the mapper input signal $b_j$. This will be guaranteed by a correctly designed mapper.

The mapper P generates during each sample period at its output a parallel word of q bits which, when put in series, represents q bits of the output signal $a_n$. This parallel word of q bits is applied to a parallel to series converter PS for conversion to the high sample rate signal $a_n$, to an adder $D_{13}$ for generating the signal $A_{0j}$, to a set of multipliers $M_9$ with adder $D_{14}$ for generating the signal $A_{1j}$ and to a set of multipliers $M_{10}$ with adder $D_{15}$ for generating the signal $A_{2j}$. The arrangement of adders $D_{13}$, $D_{14}$, $D_{15}$ and multipliers $M_9$, $M_{10}$ is identical to the arrangement of adders $D_0$, $D_1$, $D_2$ and multipliers $M_1$, $M_2$ of FIG. 1.

The mapper of FIG. 3, which is designed for q=4, comprises three quantizer-subtracter combinations $Q_1-S_7$, $Q_2-S_8$, $Q_3-S_9$ and a final quantizer $Q_4$. Each of the quantizers is a 1-bit quantizer, which outputs one bit of the q-bit output sequence. In each of the combinations the subtracter calculates the difference between the input and the output of the quantizer. The difference signal of the first combination $Q_1-S_7$ is weighed in a multiplier $M_{11}$ and the so weighed difference signal is applied as input signal to the second combination $Q_2-S_8$. The difference signal of the first combination and the difference signal of the second combination are each weighed in a multiplier $M_{12}$ and $M_{13}$ respectively and added in an adder $D_{16}$. The output of this adder constitutes the input signal of the third combination. The difference signal of the first, second and third combinations are each weighed in a multiplier $M_{14}$, $M_{15}$ and $M_{16}$ respectively and added in an adder $D_{17}$ to constitute the input signal of the final quantizer $Q_4$. Preferably, the multipliers $M_{11}$, $M_{13}$ and $M_{16}$ have the same weighing factor and also the multipliers $M_{12}$ and $M_{15}$ have the same weighing factor. The values of the weighing factors may be calculated with the algorithm shown in the above-mentioned article in "Int. Journal of Circuit Theory and Applications", vol. 25, pp. 419–437, 1997.

In the reverse Rebic algorithm the mapping process is not free of errors with the consequence that the signals $A_{0j}$, $A_{1j}$ and $A_{2j}$, which are fed back, are also not free of errors. This is the basic reason that formulas (4a) and (4b) cannot be applied in a reverse Rebic algorithm and therefore it is not possible to make a reverse Rebic structure with one integrator less than the order of the Rebic is.

As with the structure of the forward Rebic, also the reverse Rebic structure of FIG. 2 can be modified in several ways. An example thereof is given in FIG. 3, which comes in place of the elements $S_6$, F, $M_6$, $D_8$, $D_9$ and $I_6$ of FIG. 2. The arrangement comprises an integrator $I_7$ with two input signals $b_j-A_{2j}$ and $-r_{1j}-T_{1j}$. For the input signal $b_j-A_{2j}$ the integrator operates as a delaying integrator with z-transform $1/(z-1)$. For the input signal $-r_{1j}-T_{1j}$ the integrator operates as a non-delaying integrator with z-transform $z/(z-1)$. The output signal of the integrator $I_7$ is: $b_{(j-1)}-A_{2(j-1)}-r_{1j}-T_{1j}-r_{2(j-1)}=-r_{2j}$.

As indicated above, the algorithm as defined in the formulas sheet is based on a low pass filter function with impulse response $$h(t) = U(t) \sum_{m=0}^{M} (\alpha_m (t/T))^m.$$

However, impulse responses with another power series expansion may also be used, so that $$h(t) = U(t) \sum_{m=0}^{M} (\alpha_m ((t+CT)/T))^m,$$

wherein C is any real constant. For instance, when C=1 the impulse response is $$h(t) = U(t) \sum_{m=0}^{M} (\alpha_m ((t+T)/T))^m$$

and the formulas of the formulas sheet equally apply, except in that the summation-borders for the counter n have to be changed as follows:

$$\sum_{n=0}^{jq+q-1} a_n \ldots$$

in equation (1) should read $$\sum_{n=0}^{jq} a_n \ldots, \sum_{n=jq}^{jq+q-1} a_n \ldots$$

in equations (2), (2a) and (3a) should read $$\sum_{n=jq-q+1}^{jq} a_n \ldots$$

and finally $$\sum_{n=0}^{jq-1} a_n \ldots$$

in equations (2), (2a) and (3b) should read $$\sum_{n=0}^{jq-q} a_n \ldots$$

The implication in the structures of FIGS. 1 and 2 is that the weighing factors of the multiplying sets $M_1$ and $M_9$ should be 1, 1+1/q, 1+2/q ... 2−1/q in stead of 1/q, 2/q, 3/q ... q/q and that the weighing factors of the multiplier sets $M_2$ and $M_{10}$ should be 1, $(1+1/q)^2$, $(1+2/q)^2$ ... $(2-1/q)^2$ in stead of $(1/q)^2$, $(2/q)^2$, $(3/q)^2$ ... $(q/q)^2$ As any higher order feedback system the Rebic system suffers from instability and this risk is higher the higher the order of the system is. Because the third order system of FIG. 3 is noise free, this system is stable and operation is possible without further measures. If noise is introduced, like it is the case in the reverse mode as a consequence of the mapping process, the system may be unstable. In fact, the larger the noise, the higher the instability. This is due to the fact that internal noise overloads the loop-quantizer, thereby violating the amplitude and phase margins of the feedback loop. There are two independent mechanisms that can be used to control the stability for higher order systems: a linear one and a non-linear one. In the third-order example of FIG. 2 the linear one consists in increasing the parameter $\alpha_1'$. The more increase is made, the more stability is obtained, because the system tends to move from third order towards second order behaviour. The non-linear mechanism consists in the introduction of a clipper G in an integrator, as is shown in FIG. 4. This measure changes the spectral behaviour of the integrator for large signals into a more direct connection. For effective stability control both mechanisms can be applied simultaneously.

Formulas:

$$\sum_{m=0}^{M} \alpha_m \sum_{k=0}^{J} b_k(j+1-k)^m = \sum_{m=0}^{M} \alpha_m \sum_{n=0}^{jq+q-1} a_n(j+1-n/q)^m \quad (1)$$

$$b_j \sum_{m=0}^{M} \alpha_m = \sum_{m=0}^{M} \alpha_m \sum_{n=jq}^{jq+q-1} a_n(j+1-n/q)^m +$$

$$\sum_{m=0}^{M} \alpha_m \sum_{n=0}^{jq-1} a_n(j+1-n/q)^m - \sum_{m=0}^{M} \alpha_m \sum_{k=0}^{j-1} b_k(j+1-k)^m \quad (2)$$

$$b_j = \sum_{m=0}^{M} \alpha_m' \sum_{n=jq}^{jq+q-1} a_n(j+1-n/q)^m +$$

$$\sum_{m=0}^{M} \alpha_m' \sum_{n=0}^{jq-1} a_n(j+1-n/q)^m - \sum_{m=0}^{M} \alpha_m' \sum_{k=0}^{j-1} b_k(j+1-k)^m \quad (2a)$$

-continued $$A_{ij} = \sum_{n=jq}^{jq+q-1} a_n(j+1-n/q)^i \quad (3a)$$

$$r_{ij} = \sum_{n=0}^{jq-1} a_n(j+1-n/q)^i - \sum_{n=0}^{j-1} b_k(j+1-k)^i \quad (3b)$$

$$b_j = \sum_{m=0}^{M} \alpha_m'(A_{mj} + r_{mj}) \quad (3c)$$

$$r_{mj} = \sum_{i=0}^{m} \binom{m}{i} T_{ij} \quad (3d)$$

$$T_{ij} = A_{i(j-1)} - b_{j-1} + r_{i(j-1)} \quad (3e)$$

$$b_{j-1} = \sum_{m=0}^{M} \alpha_m'(A_{m(j-1)} + r_{m(j-1)}) \quad (4a)$$

$$\sum_{m=0}^{M} \alpha_m' T_{mj} = 0 \quad (4b)$$

$$b_j = \alpha_1'(A_{1j} + r_{1j}) + \alpha_2'(a_{2j} + r_{2j}) \quad (5a)$$

$$b_j = \alpha_1'(A_{1j} + T_{0j} + T_{1j}) + \alpha_2'(A_{2j} + T_{0j} + 2T_{1j} + T_{2j}) \quad (5b)$$

$$b_j = \alpha_1'(A_{1j} + T_{0j}) + \alpha_2'(A_{2j} + T_{0j} + 2T_{1j}) \quad (5c)$$

The invention claimed is:

1. A method of converting the sample rate of a discrete-time input signal with sample rate $q.f_s$ to a discrete-time output signal with a sample rate $f_s$ which is a sub multiple of the sample rate of the input signal (q=integer larger than 1), the method comprising the steps of series to parallel converting the input signal to generate non-overlapping words of q samples of the input signal and of processing said words at the sub multiple rate $f_s$ in accordance with a recursive algorithm comprising a low-pass filtering function, characterized in that the algorithm is based on a power-series expansion of the impulse-response of the low-pass filtering function.

2. A method of converting the sample rate of a discrete-time input signal with sample rate $f_s$ to a discrete-time output signal with a sample rate $q.f_s$ which is a multiple of the sample rate of the input signal (q=integer larger than 1), the method comprising the steps of processing said input signal at the sample rate $f_s$ in accordance with a recursive algorithm comprising a low-pass filtering function to obtain non-overlapping words of q samples of the output signal and of parallel to series converting said words to generate the discrete-time $q.f_s$ sample rate output signal, characterized in that the algorithm is based on a power-series expansion of the impulse-response of the low-pass filtering function.

3. An apparatus for sample rate conversion for converting the sample rate of a discrete-time input signal with sample rate $q.f_s$ to a discrete-time output signal with a sample rate $f_s$ which is a sub multiple of the sample rate of the input signal (q=integer larger than 1), comprising:

means for series to parallel converting the input signal to generate non-overlapping words of q samples of the input signal;

means for processing said words at the sub multiple rate $f_s$ in accordance with a recursive algorithm comprising a low-pass filtering function, characterized in that the algorithm is based on a power-series expansion of the impulse-response of the low-pass filtering function, said means for processing comprising a number of integrators in cascade.

4. The apparatus of claim 3, characterized in that the low pass filtering function is of predetermined order and that the number of integrators in said cascade of integrators is one less than the said predetermined order.

5. The apparatus as claimed in claim 3 characterized in that at least one of said integrators comprises a clipper.

6. An apparatus for converting the sample rate of a discrete-time input signal with sample rate $f_s$ to a discrete-time output signal with a sample rate $q.f_s$ which is a multiple of the sample rate of the input signal (q=integer larger than 1), comprising:

means comprising a number of integrators in cascade for processing said input signal at the sample rate $f_s$ in accordance with a recursive algorithm comprising a low-pass filtering function to obtain non-overlapping words of q samples of the output signal, wherein the algorithm is based on a power-series expansion of the impulse-response of the low-pass filtering function; and means for parallel to series converting said words to generate the discrete-time $q.f_s$ sample rate output signal; and receiving a mapper input signal from said integrators in cascade and generating said non-overlapping words of q samples of the output signal.

7. The apparatus as claimed in claim 6, characterized in that said mapper comprises a cascade of quantizer-subtracter combinations, each of said combinations comprising a 1-bit quantizer for generating one of the bits of said non-overlapping words of q bits and a subtracter for subtracting the input- and output-signals of the 1-bit quantizer, that the first of said combinations in the cascade receives the mapper input signal, that each of the other of said combinations in the cascade receives a weighed sum of the output signals of the subtracters of the previous combinations in the cascade and that a final quantizer receives a weighed sum of the output signals of all subtracters in the cascade and generates the final bit of said non overlapping words of q bits.

* * * * *